United States Patent [19]

Ishibashi et al.

[11] Patent Number: 4,888,622

[45] Date of Patent: Dec. 19, 1989

[54] SUPERCONDUCTOR ELECTRON DEVICE

[75] Inventors: Akira Ishibashi; Kenji Funato, both of Kanagawa; Yoshifumi Mori, Chiba, all of Japan

[73] Assignee: Sony Corporation, Tokyo, Japan

[21] Appl. No.: 271,911

[22] Filed: Nov. 16, 1988

[30] Foreign Application Priority Data

Nov. 17, 1987 [JP] Japan .............................. 62-290355

[51] Int. Cl.$^4$ ........................................... H01L 39/22
[52] U.S. Cl. ........................................... 357/5; 357/4; 307/306; 307/245
[58] Field of Search ................ 357/5, 4; 307/306, 245

[56] References Cited

U.S. PATENT DOCUMENTS

| | | | |
|---|---|---|---|
| 3,363,200 | 1/1968 | Jaklevic | 357/5 X |
| 3,784,854 | 1/1974 | Herrell | 357/5 X |
| 3,803,459 | 4/1974 | Matisoo | 307/306 X |
| 4,168,441 | 8/1979 | McDonald | 307/306 X |
| 4,334,158 | 6/1982 | Faris | 357/5 X |
| 4,371,796 | 1/1983 | Takada | 357/5 X |

Primary Examiner—Martin H. Edlow
Attorney, Agent, or Firm—Hill, Van Santen, Steadman & Simpson

[57] ABSTRACT

A superconducting electron device is disclosed, in which a pair of parallel superconducting channels each having a Josephson junction therein are provided between source and drain electrodes, and a gate electrode is provided to apply a voltage to the channels to make potentials at each channels different to each other. The current flow through channels is controlled by the application of a voltage to the gate electrode based on electrostatic Aharanov-Bohm effect. The device uses the coherency characteristics of the superconducting material, thus high speed switching operation can be achieved.

1 Claim, 2 Drawing Sheets

SUPERCONDUCTOR ELECTRON DEVICE

BACKGROUND OF THE INVENTION

1. Field of the Invention

The present invention relates to superconducting electron devices and more particularly to a quantum interference transistor utilizing superconducting channel.

2. Description of the Prior Art

So far Josephson junction devices have been proposed as electron devices using a superconductor. The Josephson junction device is essentially of a two-terminal element so that it is difficult to use the same in practice. Also, it may be considered to make the Josephson junction device as a quasi-3-terminal device. However, the structure for this becomes complicated so that it is difficult to apply such a modified device to an integrated circuit.

Further, as a 3-terminal superconducting electron device, there is proposed a transistor by forming source and drain electrodes formed of a superconducting material on a semiconductor body. The leaked Cooper pairs from the electrodes are controlled by an application of a gate voltage relative to the source electrode to control the current of Cooper pair. However, the device is essentially regarded as a semiconductor device.

Furthermore, it is proposed that the device is operated just like a metal gate type field-effect-transistor (FET) using superconductor, i.e., so-called MES-FET (*M*etal *S*emiconductor-FET). This previously-proposed element merely utilizes the superconductor as a resistor having a low electric resistivity, and it does not effectively utilize its coherency which is one of the major characteristics in the superconductor.

It should be noted that the prior art electron device using the superconductivity is operated on the basis of a transition between a superconducting state and a non-superconducting state which are made corresponding to a binary state of "0" and "1". In other words, since the prior art superconducting electron device is not operated only in the superconducting state, in the prior art device, a transition speed at which it returns at least from the non-superconducting state to the superconducting state is substantially the same as that of the regular device which does not utilize the superconductor. Thus, this kind of superconducting electron device is restricted in increasing its operation speed.

On the other hand, a quantum interference transistor (QUIT) utilizing Aharanov-Bohm effect was reported at the IEDM (International Electron Device Meeting) '86, pp. 76 to 79. According to the QUIT which does not use a superconducting substance, however, a single electron is a charge carrier and discharges a phonon at a high temperature. Hence, energy relaxation occurs and loses coherency. Thus, such a QUIT cannot be operated in the presence of a phonon scattering.

OBJECTS AND SUMMARY OF THE INVENTION

It is an object of the present invention to provide a novel superconducting electron device.

It is another object of the present invention to provide a 3-terminal electron device utilizing superconducting current paths.

According to an aspect of the present invention, there is provided a superconducting electron device comprising:

(a) an insulating substrate;

(b) first and second channels formed on said insulating substrate, each formed of a superconducting material and having a Josephson junction therein;

(c) a first electrode connected to each one end of said first and second channels;

(d) a second electrode connected to each another end of said first and second channels; and (e) a third electrode applying a voltage to said first and second channels to make potentials at said first and second channels different to each other.

These, and other objects, features and advantages of the present invention will become apparent from the following detailed description of the preferred embodiments, to be taken in conjunction with the accompanying drawings, throughout which like reference numerals identify like elements and parts.

DESCRIPTION OF THE PREFERRED EMBODIMENTS

Figure 1:
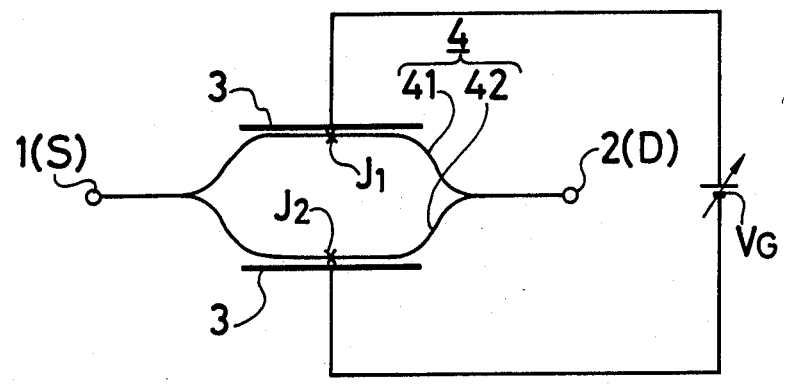
FIG. 1 is a schematic illustration of a quantum interference transistor of the present invention.

The present invention relates to quantum interference transistor utilizing a superconductor. As schematically shown in Fig. 1, first and second electrode portions 1 and 2 corresponding to, for example, source and drain electrodes are formed with a predetermined spacing therebetween. A current path 4 comprising at least first and second parallel current channels 41 and 42 with Josephson junctions $J_1$ and $J_2$ respectively interposed therein is formed between the first and second electrode portions 1 and 2. A third electrode portion, i.e., gate electrode portion 3 is formed in connection with the current path 4 to control the first and second current channels 41 and 42 such that they are made at different potentials, wherein an on-off control of a current between the first and second electrode portions 1 and 2 is performed by a voltage $V_G$ applied to the third electrode portions 3.

The quantum interference transistor of the present invention utilizes Aharanov-Bohm effect (hereinafter, simply referred to as an AB effect) in which a potential difference V between the first and second current channels 41 and 42 is controlled by the voltage applied to the third electrode portions 3 to shift the phase $\phi$ of currents concerning both of the current channels 41 and 42, whereby a switching action for turning ON and OFF the path between the first and second electrode portions 1 and 2 can be brought about.

This will be described below more fully. If now a vector potential A and a coordinate X are expressed by a four-dimensional vector, they are expressed as follows:

$$A; \begin{bmatrix} V \\ Al \end{bmatrix} = \begin{bmatrix} V \\ A_1 \\ A_2 \\ A_3 \end{bmatrix} \quad (1)$$

$$X; \begin{bmatrix} t \\ X \end{bmatrix} = \begin{bmatrix} t \\ X_1 \\ X_2 \\ X_3 \end{bmatrix} \quad (2)$$

where a relativistic invariant is expressed as $$g_{\mu\nu} A^\mu X^\nu = VT - \mathbb{A} \cdot \mathbb{X} \quad (3)$$

wherein $g_{\mu\nu}$ is metric tensor elements.

By the second term of the right-hand side in the above equation (3), the phase $\phi$ is generally given as $$\phi = \frac{e}{\hbar} \int V D T + \frac{e}{\hbar} \phi A D \mathbb{X} \quad (4)$$

$$\left( \hbar = \frac{h}{2\pi}, h : \text{Planck's constant} \right).$$

The second term in equation (4) shows that AB effect is given by the magnetic field while the first term in equation (4) shows that the AB effect is given without using the magnetic field as $$\phi = \frac{e}{\hbar} \int V d t \quad (5)$$

In other words, the phase $\phi$ can be controlled by the electrostatic AB effect.

In FIG. 1, a drain current J(k) is given as $$J(k) = 2J_0 \sin \delta_0 \cdot \cos \phi \quad (6)$$

where k is the wave number of the charge carrier (in that case, Cooper pairs) and $\delta_0$ is a certain constant phase. Further, from the above-mentioned equation (5), $\phi$ is given as $$\phi = \frac{e}{\hbar} \int V d t = \frac{e}{\hbar} V \cdot \frac{L}{v} = \frac{e V L m}{k \hbar} \quad (7)$$

where L is the length of the separated current channels 41 and 42, e is an electron charge, v is a velocity of Cooper pairs and m is an effective mass of the Cooper pair. Consequently, a current Jtot (=the whole drain current) between the first and second electrode portions 1 and 2 is given by a sum of the charge carriers k as follows.

$$J_{tot} = \int d k \cdot J(k) \quad (8)$$

Therefore, it will be understood that the whole drain current Jtot can be controlled by the voltage V, i.e., a voltage $V_G$ applied across the third electrode portions 3. Further, according to the equations (6) and (7), the whole drain current Jtot can be turned ON and OFF on the basis of whether $\phi$ is "0" or "$\pi$"/2, thus making it possible to realize a device having a 3-terminal configuration, i.e., transistor.

In addition, since the quantum interference transistor of the present invention can be operated with the superconducting state always being kept, the quantum interference transistor of the present invention can exhibit very high operation speed.

The reason that a transistor utilizing non-superconducting metal or semiconductor by the AB effect cannot be realized is due to inelastic scattering of LA (longitudinal acoustic), LO (longitudinal optical), TA (transverse acoustic) and TO (transverse optical) phonons. These inelastic scatterings can be avoided by the superconductor.

According to the structure of the present invention, as described above, the multiple connection channel 4 formed of the first and second current channels 41 and 42 is used. In this case, Josephson junctions $J_1$ and $J_2$ are provided in both of the first and second current channels 41 and 42 so that the multiple connection current channel 4 can be formed of a superconductor. In other words, in the absence of the Josephson junctions $J_1$ and $J_2$, a magnetic flux across the loop formed by both of the first and second current channels 41 and 42 is an integer multiple of the unit magnetic flux so that a superconducting current for compensation for the magnetic flux is flowed through the loop. Thus, only a constant current is flowed through the second electrode portion side. Thus, the control operation cannot be performed by the third electrode portions 3. Example An example of the present invention will hereinafter be described with reference to FIG. 2 which shows a plan view of the device according to the present invention and FIG. 3 which shows a cross-sectional view taken through the line A—A in FIG. 2.

Figure 2:
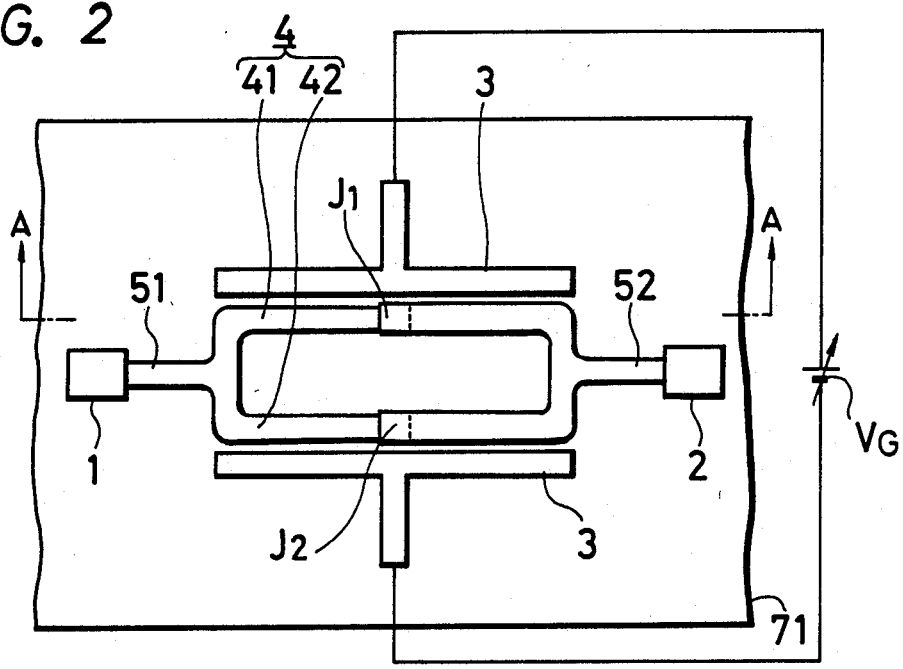
FIG. 2 is an enlarged plan view of an embodiment of the quantum interference transistor according to the present invention.
Figure 3:
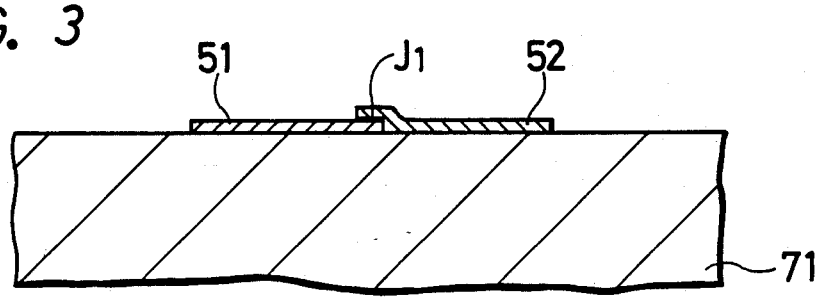
FIG. 3 is a cross-sectional view taken through the line A—A in FIG. 2.

Referring to FIGS. 2 and 3, superconductive layers 51 and 52 each being made of, for example, YBa$_2$Cu$_3$O$_{7-\delta}$ and having a Y-letter pattern, are formed on an insulating substrate 71 made of, for example, SrTiO$_3$ in such a manner that the top ends of their branched portions are overlapped one another to form Josephson junctions $J_1$ and $J_2$ at the overlapped portions, respectively. As described above, with the provision of Josephson junctions $J_1$ and $J_2$, the first and second channels 41 and 42 are formed in parallel to each other by both of the branched portions of the superconductive layers 51 and 52 of Y-letter pattern. Third electrode portions, i.e., gate electrode portions 3 are formed at the outsides of the first and second channels 41 and 42 so as to grip them therebetween. A platinum (Pt), for example, is deposited on external output terminals of the Y-letter patterned superconductive material layers 51 and 52 in ohmic contact to form respective terminals, i.e., the first and second electrode portions 1 and 2.

Figure 4:
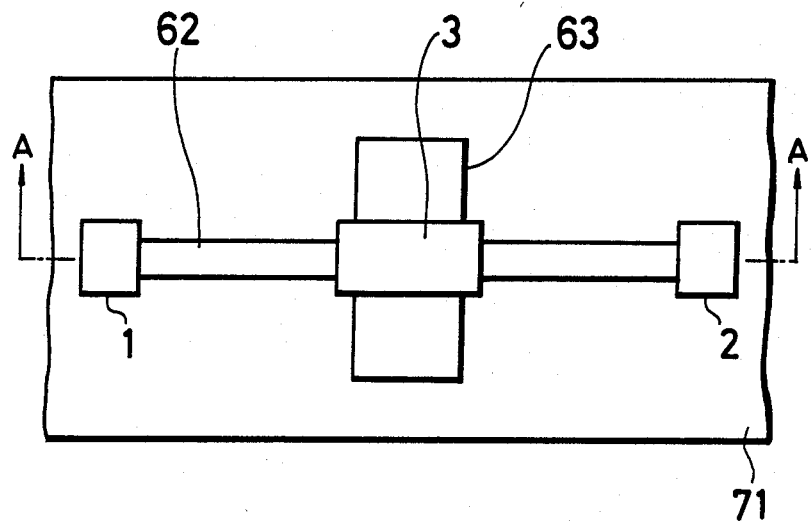
FIG. 4 is an enlarged plan view of another embodiment of the quantum interference transistor according to the present invention.
Figure 5:
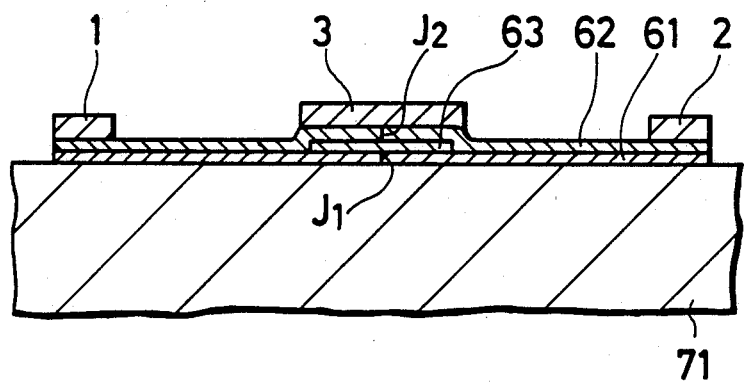
FIG. 5 is a cross-sectional view taken through the line A—A in FIG. 4.

FIG. 4 is a plan view of another embodiment of the quantum interference transistor according to the present invention, and FIG. 5 is a cross-sectional view taken through the line A—A in FIG. 4. In this case, as shown in FIGS. 4 and 5, a first superconductive material layer 61 of a band-pattern configuration is formed on a surface of the insulating substrate 71. Thereafter, the Josephson junction $J_1$ is formed by forming a very thin insulating layer in the superconductive material layer 61 by the irradiation of, for example, converted ion beams. A second superconductive material layer 62 of a band-pattern configuration is formed on the layer 61 through an insulating intermediate layer 63 at the portion including the Josephson junction $J_1$ and then the Josephson junction $J_2$ is formed therein by a similar method. The first and second superconductive material layers 61 and 62 constitute the current channels 41 and 42. Then, the gate electrode portion, i.e., the third electrode portion 3 is formed on the second superconductive material layer 62 through an insulating layer so as to completely enclose the portion in which the superconductive material layers 61, 62 and the insulating layer 63 are overlapped one another. In FIGS. 4 and 5, like parts corresponding to those of FIGS. 2 and 3 are marked with the same references and therefore need not be described.

In the above-mentioned respective embodiments, the first to third electrode portions 1 to 3 are formed in a flat fashion.

As described above, according to the present invention, since the quantum interference transistor of the present invention is of a 3-terminal configuration capable of the switching operation by controlling the voltage applied to the control electrodes (third electrode portions 3), the present invention is very suitable for being formed as a practical circuit. Further, since the first to third electrode portions 1 to 3 are disposed in a flat fashion, the present invention can be suitably applied to an integrated circuit with ease.

Also, since the quantum interference transistor of the present invention is formed as the complete superconducting device structure, a phonon is absorbed by a second electron and two electrons are coupled via phonon, in other words, the generation of Cooper pair is made, and the Cooper pair have no inelastic scattering therebetween, it is possible to solve the problem mentioned in the beginning in which the coherency is lost by the phonon discharge occurred in the QUIT which utilizes the AB effect but which is not formed of the superconductive material. In other words, according to the present invention, the quantum interference transistor of the present invention can be operated up to the temperature at which superconductivity is lost.

Further, since the quantum interference transistor of the present invention is formed as the complete superconductor structure and all operations are performed in a superconducting manner, the electric resistivity is always nearly zero. Furthermore, since the quantum interference transistor of the present invention utilizes the coherency, the present invention can be operated at very high speed and can reduce the power consumption.

In addition, according to the present invention, since positive and negative mutual conductance of the transistor utilizing the electrostatic AB effect is utilized, the quantum interference transistor of the present invention can be formed as a complementary circuit which consumes very small power.

It should be understood that the above description is presented by way of example on the preferred embodiments of the invention and it will be apparent that many modifications and variations thereof could be effected by one with ordinary skill in the art without departing from the spirit and scope of the novel concepts of the invention so that the scope of the invention should be determined only by the appended claim.

We claim as our invention:

1. A superconducting electron device comprising:
    (a) an insulating substrate;
    (b) first and second channels formed on said insulating substrate, each formed of a superconducting material and having a Josephson junction therein;
    (c) a first electrode connected to each one end of said first and second channels;
    (d) a second electrode connected to each another end of said first and second channels; and
    (e) a third electrode applying a voltage to said first and second channels to make potentials at said first and second channels different to each other.

* * * * *